US010509088B2

(12) United States Patent
Tomoda et al.

(10) Patent No.: US 10,509,088 B2
(45) Date of Patent: Dec. 17, 2019

(54) OBTAINING AN ECHO TRAIN LENGTH IN A MAGNETIC RESONANCE APPARATUS

(71) Applicant: General Electric Company, Schenectady, NY (US)

(72) Inventors: Yoshihiro Tomoda, Tokyo (JP); Masanori Ozaki, Tokyo (JP)

(73) Assignee: General Electric Company, Schenectady, NY (US)

( * ) Notice: Subject to any disclaimer, the term of this patent is extended or adjusted under 35 U.S.C. 154(b) by 159 days.

(21) Appl. No.: 15/546,952

(22) PCT Filed: Dec. 22, 2015

(86) PCT No.: PCT/US2015/067344
§ 371 (c)(1),
(2) Date: Jul. 27, 2017

(87) PCT Pub. No.: WO2016/122810
PCT Pub. Date: Aug. 4, 2016

(65) Prior Publication Data
US 2018/0017649 A1  Jan. 18, 2018

(30) Foreign Application Priority Data
Jan. 30, 2015 (JP) .................................. 2015-016180

(51) Int. Cl.
*G01R 33/00* (2006.01)
*G01R 33/561* (2006.01)
(Continued)

(52) U.S. Cl.
CPC ..... *G01R 33/5615* (2013.01); *G01R 33/4818* (2013.01); *G01R 33/4835* (2013.01);
(Continued)

(58) Field of Classification Search
CPC .. G01R 33/34; G01R 33/34007; G01R 33/36; G01R 33/3635; G01R 33/3642;
(Continued)

(56) References Cited

U.S. PATENT DOCUMENTS

2008/0319301 A1* 12/2008 Busse .................... A61B 5/055
600/410
2010/0087729 A1*  4/2010 Takizawa ............... A61B 5/055
600/413
(Continued)

FOREIGN PATENT DOCUMENTS

JP       08299297 A     11/1996
JP    2000-325327 A     11/2000
(Continued)

OTHER PUBLICATIONS

Gordon Sze, et al., "Fast Spin-Echo MR Imaging of the Cervical Spine: Influence of Echo Train Length and Echo Spacing on Image Contrast and Quality", American Journal of Neuroradiology, 1993 9, vol. 14, Issue 5, p. 1203-p. 1213.
(Continued)

*Primary Examiner* — Thang X Le

(57) ABSTRACT

An MR apparatus 100 performs a sequence for acquiring an echo train from a subject. The MR apparatus 100 comprises upper-limit-value determining unit for determining an upper limit value etl_max for the echo train length based on a value X1 and a value X2, the value X1 including echo spacing ESP and a lower limit value TEz_max for a maximum echo time. The MR apparatus 100 further comprises unit for obtaining an echo train length based on the upper limit value etl_max for the echo train length and a number of views ypoint in which data acquisition is performed.

18 Claims, 13 Drawing Sheets

(51) Int. Cl.
*G01R 33/483* (2006.01)
*G01R 33/54* (2006.01)
*G01R 33/48* (2006.01)
*G01R 33/565* (2006.01)

(52) U.S. Cl.
CPC .......... *G01R 33/543* (2013.01); *G01R 33/546* (2013.01); *G01R 33/565* (2013.01); *G01R 33/5617* (2013.01)

(58) Field of Classification Search
CPC .. G01R 33/48; G01R 33/4818; G01R 33/481; G01R 33/4824; G01R 33/446; G01R 33/4835; G01R 33/4828; G01R 33/54; G01R 33/543; G01R 33/561; G01R 33/563; G01R 33/565; G01R 33/5611; G01R 33/5612; G01R 33/583; G01R 33/5659; G01R 33/56518; G01R 33/56536; G01R 33/56572; G01R 33/5614; G01R 33/5616; G01R 33/56509; G01R 33/341; G01R 33/385; G01R 33/56358; A61B 5/055; A61B 5/0555; A61B 5/7278; A61B 5/725

See application file for complete search history.

(56) References Cited

U.S. PATENT DOCUMENTS

| | | | |
|---|---|---|---|
| 2012/0056620 A1 | 3/2012 | Feinberg | |
| 2013/0249548 A1* | 9/2013 | Stemmer | G01R 33/4835 324/309 |
| 2013/0307542 A1* | 11/2013 | Chen | G01R 33/5613 324/318 |
| 2013/0335082 A1* | 12/2013 | Paul | G01R 33/5615 324/309 |

FOREIGN PATENT DOCUMENTS

| | | |
|---|---|---|
| JP | 2008-307303 A | 12/2008 |
| JP | 2011 229546 A | 11/2011 |
| JP | 2014-212946 A | 11/2014 |
| WO | 2012-098955 A1 | 7/2012 |
| WO | 2014/176428 A1 | 10/2014 |

OTHER PUBLICATIONS

JP OA with English Translation for Application No. 2015-016180. Office Action dated Sep. 19, 2017. 2 pages.
International Search Report and Written Opinion for International Application No. PCT/US2015/067344, dated Apr. 8, 2016. 17 pages.
"Fast spin-echo MR imaging of the cervical spine: influence of echo train length and echo spacing on image contrast and quality.", AJNR. American Journal of Neuroradiology Sep.-Oct. 1993, vol. 14, No. 5. Sep. 1993 (Sep. 1993), pp. 1203-1213, XP055261650, ISSN: 0195-6108, p. 1206, left-hand column, paragraph 2-p. 1207, left-hand column, paragraph 1.
E M Escobedo et al: "Usefulness of turbo spin-echo MR imaging in the evaluation of meniscal tears: comparison with a conventional spin-echo sequence.", American Journal of Roentgenology, vol. 167, No. 5, Nov. 1, 1996 (Nov. 1, 1996), pp. 1223-1227, XP055261652, US ISSN: 0361-803X, DOI: 10.2214/ajr.167.5.8911185 chapter "Discussion".
Reeder S B et al: "Multi-echo segmented k-space imaging: An optimized hybrid sequence for ultrafast cardiac imaging", vol. 41, No. 2, 1999, pp. 375-385, XP0555261648, ISSN: 0740-3194 chapters "Theory" and "Discussion"; p. 376.
Frederick H. Epstein et al: "Optimization of fast cardiac imaging using an echo-train readout", Journal of Magnetic Resonance Imaging, vol. 11, No. 2, Feb. 1, 2000 (Feb. 1, 2000), pp. 75-80, XP055261653, US ISSN: 1053-1807, DOI: 10.1002/ (SICI) 1522-2586 (200002) 11:2<75::A1 D-JMRI1>3.0.CO;2-P the whole document.
Constable R T et al: "Factors influencing contrast in fast spin-echo MR imaging", Magnetic Resonance Imaging, Elsevier Science, Tarrytown, NY, US, vol. 10, No. 4, Jan. 1, 1992 (Jan. 1, 1992), pp. 497-511, XP026425127, ISSN: 0730-725X [retreived on Jan. 1, 1992] section "Magnetization Transfer and Direct Saturation Effects".

* cited by examiner

| PARAMETER | SCAN CONDITION A1 |
|---|---|
| ECHO TIME TE | TE1 |
| RESOLUTION Xres | Xres1 |
| RESOLUTION Yres | Yres1 |
| NUMBER OF SLICES N | N1 |
| SLICE THICKNESS TH | TH1 |
| ECHO SPACING ESP | ESP1 |
| NUMBER OF REPETITIONS m | m1 |
| ECHO TRAIN LENGTH ETL | ETL1 |
| REPETITION TIME TR | TR1 |

FIG. 6

| PARAMETER | SCAN CONDITION A1 |
|---|---|
| ECHO TIME TE | TE1 |
| RESOLUTION Xres | Xres1 |
| RESOLUTION Yres | Yres1 |
| NUMBER OF SLICES N | N1 |
| SLICE THICKNESS TH | TH1 |
| ECHO SPACING ESP | ESP1 |
| NUMBER OF REPETITIONS m | m1 |
| ECHO TRAIN LENGTH ETL | ETL1 |
| REPETITION TIME TR | TR1 |

| SCAN TIME | $t_1 = m_1 \times TR_1$ |
|---|---|

| PARAMETER | SCAN CONDITION A1 | SCAN CONDITION A2 |
|---|---|---|
| ECHO TIME TE | TE1 | TE2 |
| RESOLUTION Xres | Xres1 | Xres2 |
| RESOLUTION Yres | Yres1 | Yres2 |
| NUMBER OF SLICES N | N1 | N2 |
| SLICE THICKNESS TH | TH1 | TH2 |
| ECHO SPACING ESP | ESP1 | ESP2 |
| NUMBER OF REPETITIONS m | m1 | m2 |
| ECHO TRAIN LENGTH ETL | ETL1 | ETL2 |
| REPETITION TIME TR | TR1 | TR2 |

| SCAN TIME | $t_1$ | Tscan |
|---|---|---|

OBTAINING AN ECHO TRAIN LENGTH IN A MAGNETIC RESONANCE APPARATUS

CROSS-REFERENCE TO RELATED APPLICATIONS

This is a national stage application under 35 U.S.C. § 371 (c) of PCT Patent Application No. PCT/US2015/067344, filed on Dec. 22, 2015, which claims priority to Japanese Patent Application No. 2015-016180, filed on Jan. 30, 2015, the disclosures of which are incorporated herein by reference in their entireties.

BACKGROUND

The present invention relates to a magnetic resonance apparatus for performing a sequence for acquiring an echo train from a subject, and a program applied to the magnetic resonance apparatus.

In imaging a subject with a magnetic resonance apparatus, an operator is required to set a scan condition. In setting the scan condition, however, the operator must specify values for a wide variety of parameters, which poses a problem that the operator experiences much stress. Moreover, there is another problem that the operator may sometimes specify values leading to a lengthened scan time and/or deteriorated image quality.

A fast spin echo (FSE) technique has been known as an imaging method using a magnetic resonance apparatus. The FSE technique is a method suitable for reducing the scan time because it enables a plurality of echoes to be acquired by one excitation. In setting a scan condition in the FSE technique, the operator inputs values for several kinds of parameters (resolution, echo train length, etc.). Once these parameter values have been input, a scan time is calculated based on the parameter values specified by the operator. The scan time is displayed in a display section. The operator observes the scan time displayed in the display section, and in the case that the scan time is too long, he/she modifies a value of the echo train length. As soon as the value of the echo train length has been modified, a scan time is recalculated based on the modified value of the echo train length, and the recalculated scan time is displayed in the display section. The operator observes the scan time newly displayed in the display section. Similarly, thereafter, the operator modifies the echo train length while observing how the scan time varies with the value of the echo train length, and determines a final value of the echo train length.

On the other hand, the echo train length affects image quality, so that it is desirable to define the echo train length that gives good image quality. However, it is not easy for an operator to recognize how image quality varies with the echo train length. Here arises a problem that it is difficult for an operator to specify the echo train length that gives an image with good image quality.

Accordingly, it would be desirable to provide a technique capable of automatically obtaining an optimal value for the echo train length.

SUMMARY

In a first aspect, a magnetic resonance apparatus comprising a scanning section for performing a sequence for acquiring an echo train from a subject; an upper-limit-value determining unit for determining an upper limit value for an echo train length of the echo train based on echo spacing in said echo train; and a unit for obtaining an echo train length in performing the sequence based on the upper limit value for the echo train length and a number of views in which data acquisition is performed in k-space.

In a second aspect, a program applied to a magnetic resonance apparatus that performs a sequence for acquiring an echo train from a subject, the program causing a computer to execute an upper-limit-value determining processing of determining an upper limit value for an echo train length of the echo train based on echo spacing in the echo train; and a processing of obtaining an echo train length in performing the sequence based on the upper limit value for the echo train length and a number of views in which data acquisition is performed in k-space.

An echo train is obtained based on an upper limit value for the echo train length. Since the echo train length in performing a sequence may be determined so as not to exceed the upper limit value for the echo train length, the echo train length suitable for obtaining an image with high quality can be easily obtained.

BRIEF DESCRIPTION OF DRAWINGS

FIG. 6 is a diagram schematically showing a scan condition A1.

DETAILED DESCRIPTION

Now an embodiment for practicing the invention will be described hereinbelow, although the present invention is not limited thereto.

Figure 1:
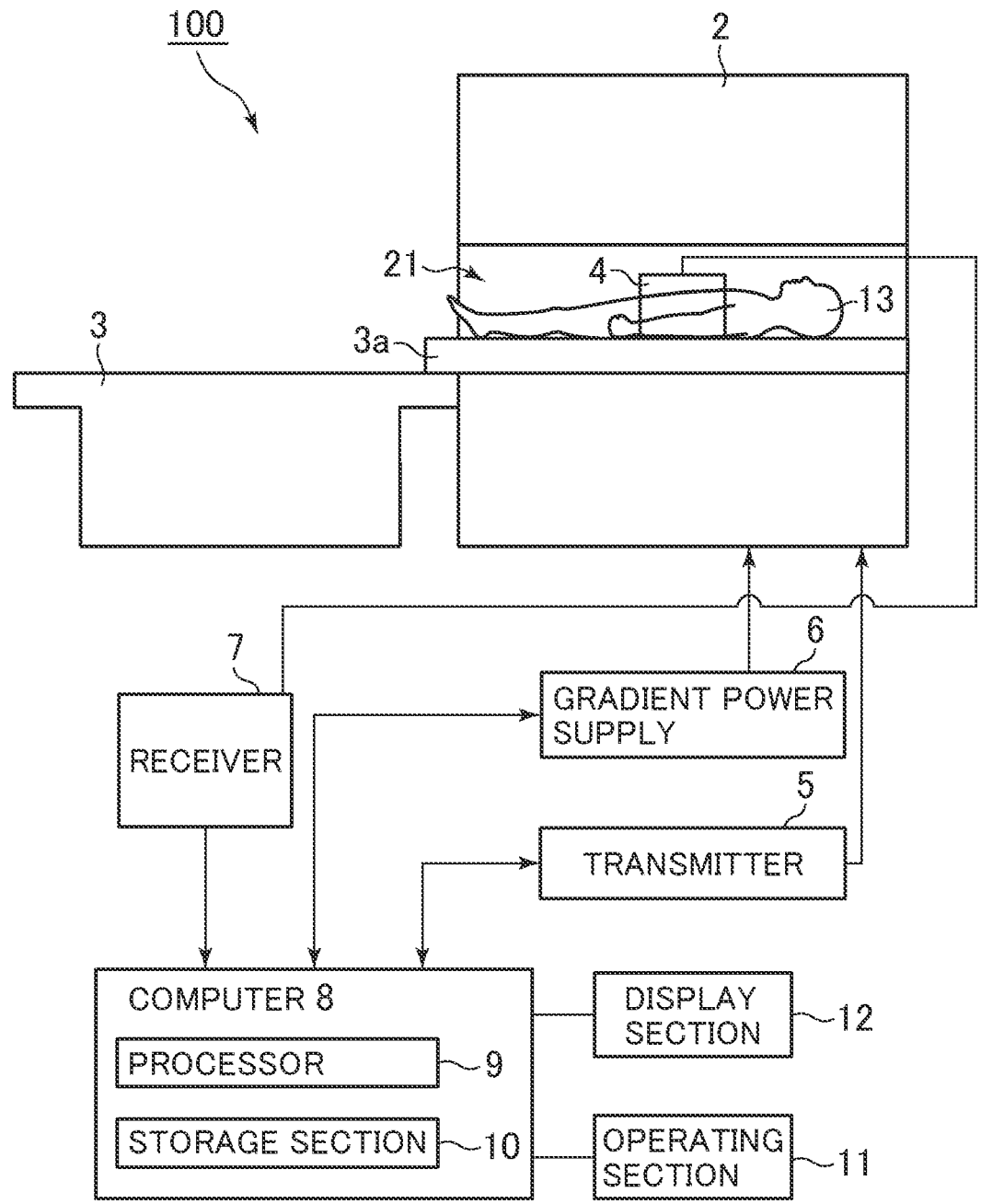
FIG. 1 is a schematic diagram of a magnetic resonance apparatus in one embodiment of the present invention.

FIG. 1 is a schematic diagram of a magnetic resonance apparatus in one embodiment of the present invention.

A magnetic resonance apparatus (referred to as "MR apparatus" hereinbelow) 100 comprises a magnet 2, a table 3, and an RF receive coil (referred to simply as "receive coil" hereinbelow) 4.

The magnet 2 has therein a reception space 21 inside of which a subject 13 is received. In the magnet 2, a superconductive coil, a gradient coil, an RF coil, etc. (not shown) are incorporated. The superconductive coil applies a static magnetic field, the gradient coil applies a gradient magnetic field, and the RF coil applies an RF pulse.

The table 3 has a cradle 3a. The cradle 3a is configured to be movable into the reception space 21 in the magnet 2. The subject 13 is carried into the reception space 21 in the magnet 2 by the cradle 3a.

The receive coil 4 is attached covering from the abdomen up to the chest of the subject 13. The receive coil 4 receives magnetic resonance signals from the subject 13.

The MR apparatus 100 further comprises a transmitter 5, a gradient power supply 6, a receiver 7, a computer 8, an operating section 11, and a display section 12.

The transmitter 5 supplies electric current to the RF coil, and the gradient power supply 6 supplies electric current to the gradient coil. The receiver 7 applies signal processing such as demodulation/detection to signals received from the receive coil 4. The magnet 2, receive coil 4, transmitter 5, gradient power supply 6, and receiver 7 together constitute the scanning section.

The computer 8 controls operation of several sections in the MR apparatus 100 to implement several kinds of operation of the MR apparatus 100, such as an operation of transmitting required information to the display section 11, and an operation of reconstructing images. The computer 8 comprises a processor 9 and a storage section 10.

Figure 2:
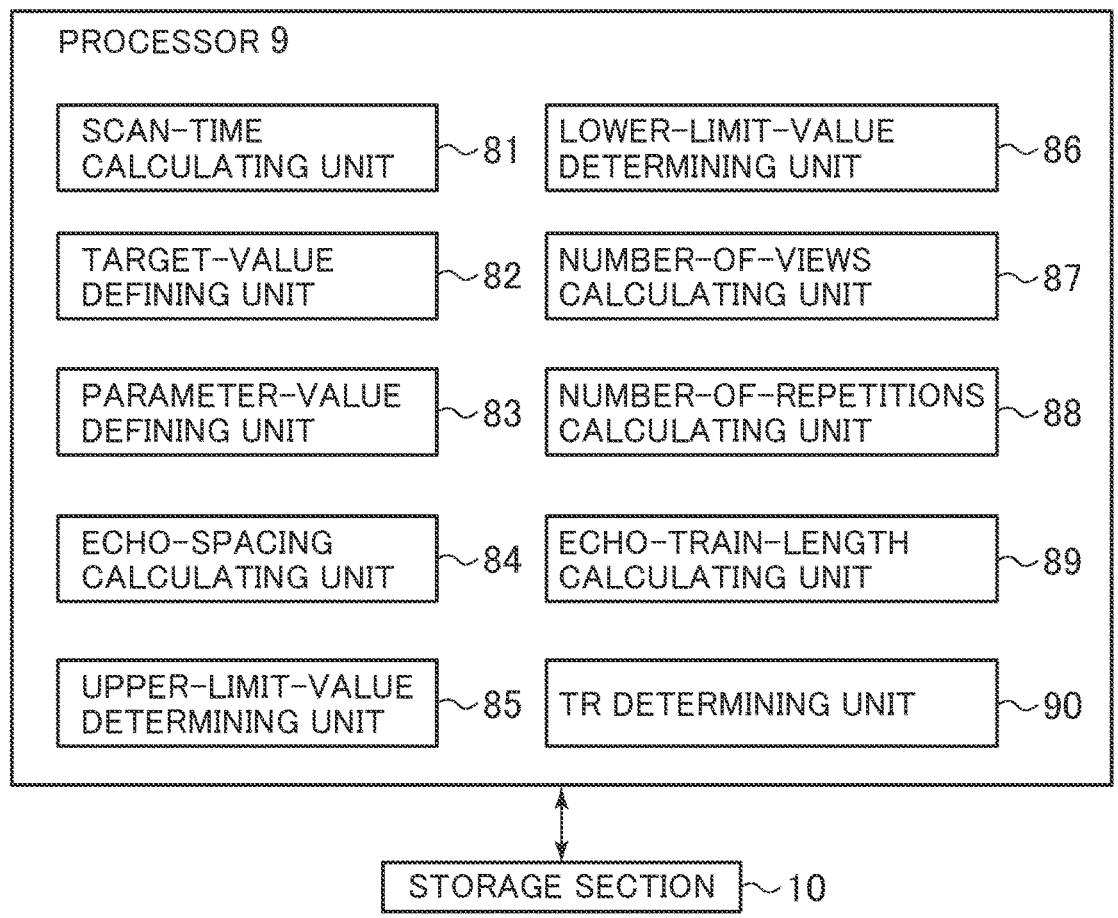
FIG. 2 is a diagram showing a processor.

The storage section 10 stores therein programs etc. executed by the processor 9. The storage section 10 may be a computer-readable non-transitory recording medium. For the non-transitory recording media, a CD-ROM, for example, may be employed. The processor 9 loads thereon a program stored in the storage section 10, and executes processing written in the program. FIG. 2 shows processing the processor 9 executes. The processor 9 constitutes scan-time calculating unit 81 through TR determining unit 90, etc. by loading programs stored in the storage section 10.

The scan-time calculating unit 81 calculates a scan time.

The target-value defining unit 82 defines a target value for the scan time used for obtaining a scan condition.

The parameter-value defining unit 83 defines parameter values.

The echo-spacing calculating unit 84 calculates echo spacing.

The upper-limit-value determining unit 85 determines an upper limit value for the echo spacing.

The lower-limit-value determining unit 86 determines a lower limit value for the echo spacing.

The number-of-views calculating unit 87 calculates a number of views in which data acquisition is performed in k-space.

The number-of-repetitions calculating unit 88 calculates a number of repetitions of a sequence group.

The echo-train-length calculating unit 89 calculates an echo train length.

The TR determining unit 90 determines a repetition time.

The processor 9 is an example for constituting the scan-time calculating unit 81 through TR determining unit 90, and it functions as these units by executing predefined programs. The number-of-repetitions calculating unit 88 and echo-train-length calculating unit 89 together constitute the unit for obtaining an echo train length.

The operating section 11 is operated by an operator for inputting several kinds of information to the computer 8. The display section 12 displays several kinds of information.

The MR apparatus 100 is constructed as described above.

Figure 3:
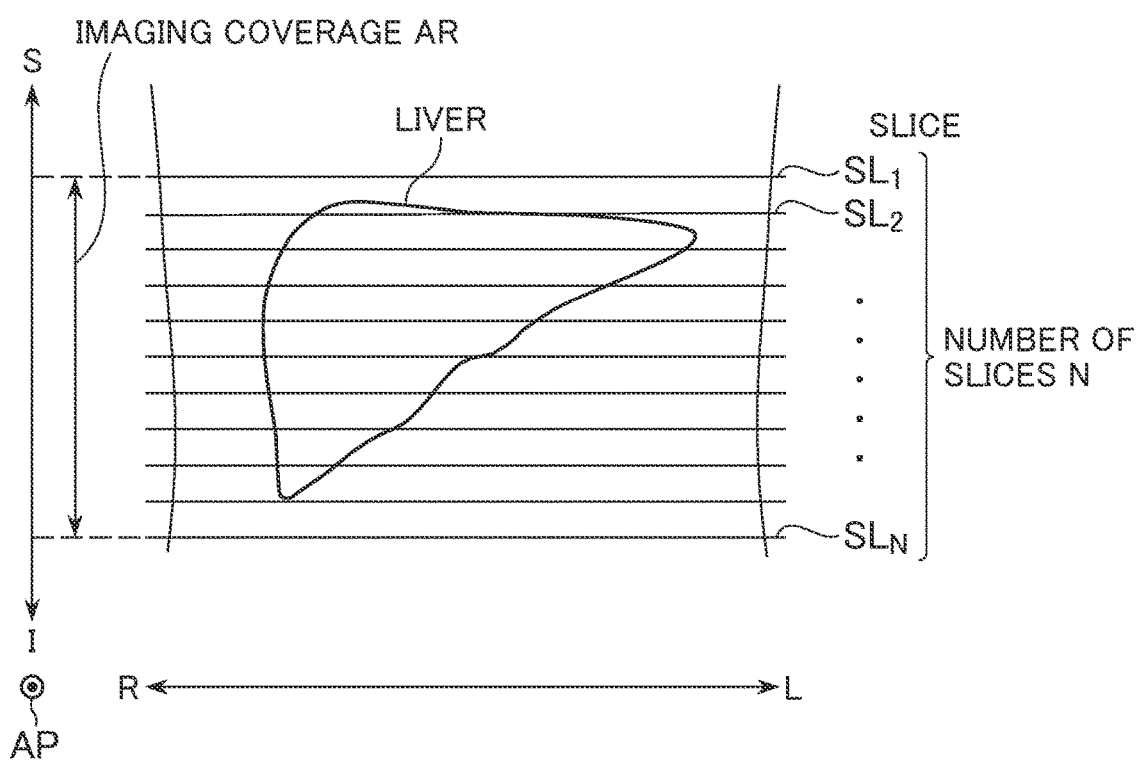
FIG. 3 is a diagram schematically showing a region to be imaged in the present embodiment.

FIG. 3 is a diagram schematically showing a region to be imaged in the present embodiment.

In the present embodiment, a liver of the subject 13 is imaged. FIG. 3 shows imaging coverage AR in an SI direction. N slices $SL_1$ to $SL_N$ (slice thickness TH) are defined within the imaging coverage AR.

Figure 4:
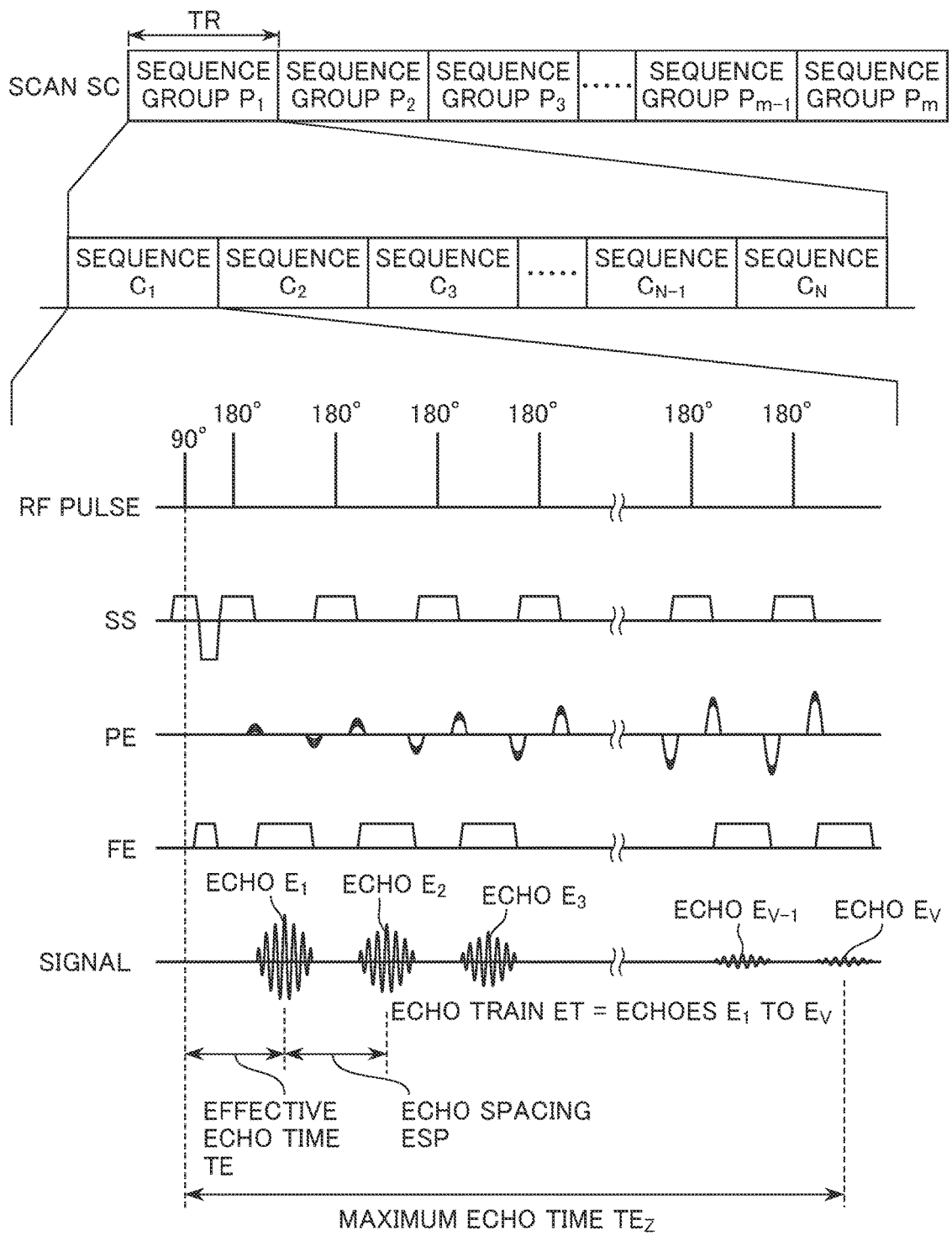
FIG. 4 is a diagram showing an example of a scan performed for acquiring data in the region to be imaged.

FIG. 4 is a diagram showing an example of a scan performed for acquiring data in the region to be imaged.

FIG. 4 shows a scan SC divided into a plurality of sequence groups $P_1$ to $P_m$. In the scan SC, one sequence group is performed during a repetition time TR. Each sequence group includes sequences $C_1$ to $C_N$ for acquiring data from the slices $SL_1$ to $SL_N$ (see FIG. 3) according to a multi-slice technique. In FIG. 4, a plurality of sequences $C_1$ to $C_N$ in a sequence group $P_1$ among the sequence groups $P_1$ through $P_m$ are shown.

The sequence $C_1$ has an excitation pulse (90-degree pulse) for exciting the slice $SL_1$ and a plurality of refocusing pulses (180-degree pulses) for refocusing the phase of spins. The sequence $C_1$ also has slice-selective gradient pulses applied in a slice-selective direction SS, phase-encoding gradient pulses applied in a phase-encoding direction PE, and frequency-encoding gradient pulses applied in a frequency-encoding direction FE. By performing the sequence $C_1$, an echo train ET consisting of a plurality of echoes E1 to Ev can be acquired. The echo spacing for the plurality of echoes E1 to Ev is represented by "ESP." To acquire data in k-space required for image reconstruction, the sequence is designed to have a varying magnitude of the gradient pulses in the phase-encoding direction.

After performing the sequence $C_1$, the sequences $C_2$ to $C_N$ for obtaining images in the slices $SL_2$ to $SL_N$ are successively performed. The sequences $C_2$ to $C_N$ may be represented by the same sequence chart as that for the sequence $C_1$, except the excitation frequency of the 90-degree pulse and 180-degree. An echo train ET can thus be acquired each time a sequence $C_1$ to $C_N$ is performed.

After performing the sequence group $P_1$, a next sequence group $P_2$ is performed. In the sequence group $P_2$, again, the sequences $C_1$ to $C_N$ are performed. Similarly, thereafter, the sequence groups $P_3$ to $P_m$ are performed. Therefore, to acquire data for image reconstruction, the sequence group is repetitively performed m times in the scan SC.

Figure 5:
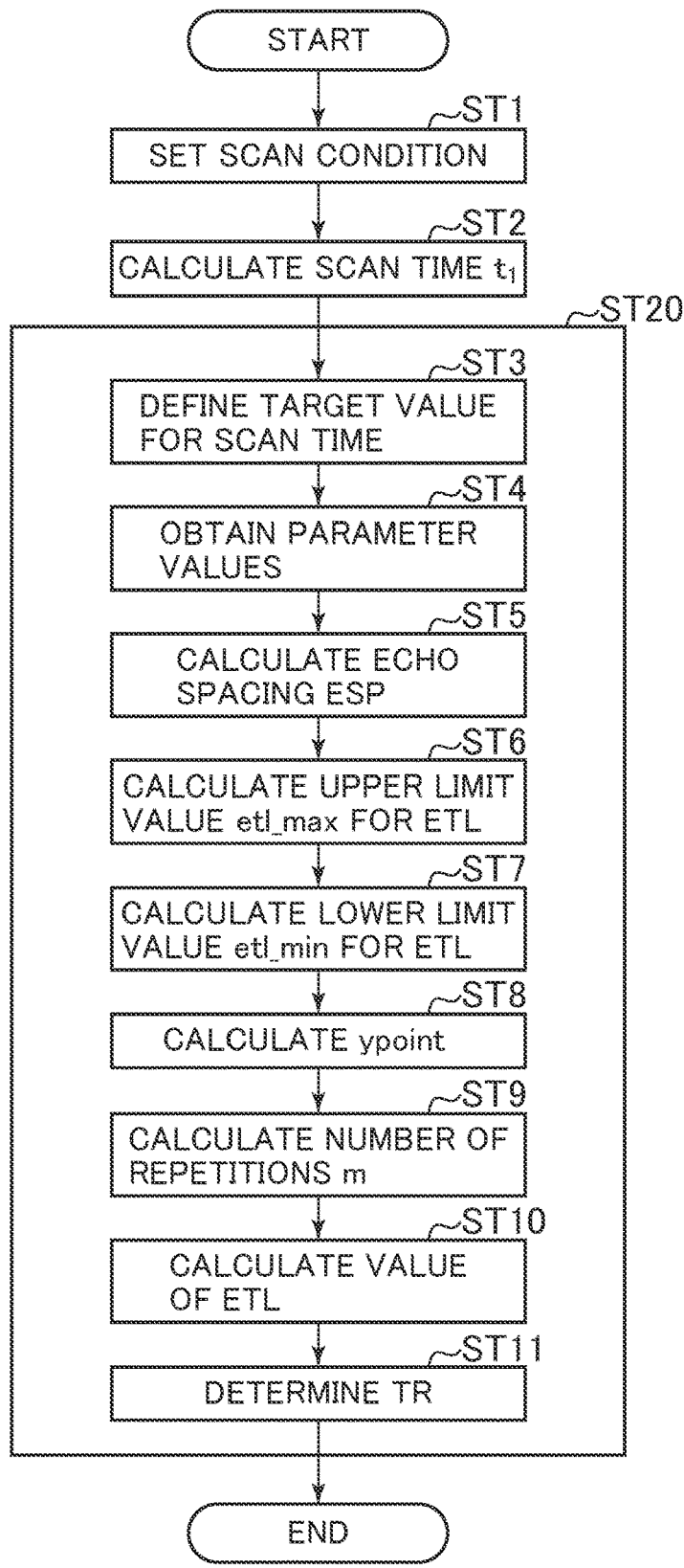
FIG. 5 is a diagram showing the flow for obtaining a scan condition.

In scanning a subject according to the FSE technique, there is a problem that too long a TEz, which is a period of time between the excitation pulse (90-degree pulse) and an echo Ev acquired last in the echo train ET (the period of time will be referred to as "maximum echo time" hereinbelow), exacerbates image degradation caused by blurring. There is also a problem that too large an echo train length ETL of the echo train ET exacerbates image degradation caused by contrast variation due to an MT (Magnetization Transfer) effect. Accordingly, the present embodiment obtains a scan condition that minimizes image degradation as much as possible before the scan SC is performed. Now a method of obtaining a scan condition that minimizes image degradation as much as possible will be described with reference to the flow shown in FIG. 5.

At Step ST1, a scan condition for the subject is set. FIG. 6 schematically shows a set scan condition A1.

FIG. 6 shows representative parameters including echo time TE, resolution $X_{res}$, resolution $Y_{res}$, number of slices N, slice thickness TH, echo spacing ESP, number of repetitions m, echo train length ETL, and repetition time TR.

The echo time TE represents an echo time (effective echo time) since the excitation pulse (90-degree pulse) is applied until data in a ky view at the center of k-space is acquired. Therefore, in the case that the data in the ky view at the center of k-space is acquired by an i-th echo (i is an integer from 1 to v), a period of time from the excitation pulse (90-degree pulse) to the i-th echo is the (effective) echo time TE. FIG. 4 shows a case in which the data in the ky view at the center of k-space is obtained by a first echo E1. Therefore, a period of time from the excitation pulse (90-degree pulse) to the first echo E1 is the (effective) echo time TE. In the case that the data in the ky view at the center of k-space is obtained by the last echo Ev, a period of time from the excitation pulse (90-degree pulse) to the last echo Ev is the (effective) echo time TE.

The resolution $X_{res}$ represents a resolution in the frequency-encoding direction FE (see FIG. 4), and the resolution $Y_{res}$ represents a resolution in the phase-encoding direction PE (see FIG. 4). The number of repetitions m represents how many times a sequence group is repetitively performed in the scan SC.

The scan condition A1 shown in FIG. 6 is represented to have TE=TE1, $X_{res}=X_{res}1$, $Y_{res}=Y_{res}1$, N=N1, TH=TH1, ESP=ESP1, m=m1, ETL=ETL1, and TR=TR1 for convenience of explanation. Values of the parameters in the scan condition A1 may be manually input by the operator, or values typically employed in each hospital may be employed without modifications. Once the scan condition A1 has been set, the process goes to Step ST2.

Figure 7:
FIG. 7 is a diagram showing a scan time t1 in the scan condition A1.

At Step ST2, the scan-time calculating unit 81 (see FIG. 2) calculates a scan time t1 taken to scan the subject with the scan condition A1. FIG. 7 shows the scan time t1 for the scan condition A1. The scan time t1 may be calculated by EQ. (1) below:

$$t1 = m \times TR \qquad \text{EQ. (1)}$$

In the scan condition A1, m=m1 and TR=TR1. Therefore, the scan time t1 may be represented by EQ. (2) below:

$$t1 = m \times TR = m1 \times TR1 \qquad \text{EQ. (2)}$$

After calculating the scan time t1, the process goes to Step ST20.

At Step ST20, aside from the scan condition A1, another scan condition capable of giving an image with good image quality is obtained. Now a method of obtaining another scan condition at Step ST20 will be described with reference to FIG. 8 hereinbelow.

Figure 8:
FIG. 8 is a diagram schematically showing an example of another scan condition A2 obtained by Step ST20.
Figure 8:

FIG. 8 is a diagram schematically showing an example of another scan condition A2 obtained by Step ST20. Now a procedure in obtaining the scan condition A2 will be described hereinbelow. Step ST20 has Steps ST3 to ST11, which will be sequentially described.

At Step ST3, the target-value defining unit 82 (see FIG. 2) defines a target value $T_{tar}$ for the scan time used for determining another scan condition. The target value $T_{tar}$ is represented by EQ. (3) below:

$$T_{tar} = t1 - \Delta t \qquad \text{EQ. (3)}$$

Since t1 has been calculated at Step ST2 it has a known value. Moreover, Δt is a value defined beforehand, and is Δt=5 seconds, for example. Therefore, the target value $T_{tar}$ for the scan time can be calculated because t1 and Δt are known. For example, in the case that t1=25 seconds and Δt=5 seconds, then $T_{tar}$=20 seconds from EQ. (3). After obtaining the target value $T_{tar}$ for the scan time, the process goes to Step ST4.

At Step ST4, parameter values for scanning the subject within the target value $T_{tar}$ for the scan time are defined. In the present embodiment, the storage section 10 stores therein a formula for obtaining parameter values suitable for scanning the subject within the target value $T_{tar}$ for the scan time (or a value close to the target value $T_{tar}$) based on the scan time t1, target value $T_{tar}$ for the scan time, and parameter values included in the scan condition A1. The parameter-value defining unit 83 (see FIG. 2) defines parameter values suitable for scanning the subject within the target value $T_{tar}$ for the scan time (or a value close to $T_{tar}$) based on the formula. Assume here that values for the resolution $X_{res}$, resolution $Y_{res}$, number of slices N, and slice thickness TH are defined as the parameter values for convenience of explanation. In FIG. 8, it is assumed that $X_{res}=X_{res}2$, $Y_{res}=Y_{res}2$, N=N2, and TH=TH2 are defined by the parameter-value defining unit 83. The echo time TE is assumed to be TE=TE1. After defining the parameter values, the process goes to Step ST5.

At Step ST5, the echo-spacing calculating unit 84 (see FIG. 2) calculates echo spacing ESP based on the parameter values defined at Step ST4. FIG. 8 shows the echo spacing ESP calculated by the echo-spacing calculating unit 84 as ESP=ESP2. After determining the echo spacing ESP, the process goes to Step ST6.

At Step ST6, the upper-limit-value determining unit 85 (see FIG. 2) determines an upper limit value etl_max for the echo train length. In the present embodiment, the upper limit value etl_max for the echo train length is determined so that the following conditions for obtaining an image with high quality are satisfied:

(Condition 1): image quality degradation caused by blurring should be minimized as much as possible; and (Condition 2): image degradation caused by contrast variation due to the MT effect should be minimized as much as possible.

Now conditions required of the echo train length ETL in order to satisfy Conditions 1 and 2 will be described hereinbelow. (For a condition required of the echo train length ETL in order to satisfy Condition 1)

In acquiring an echo train ET by the FSE technique, too long a maximum echo time TEz (see FIG. 4) poses a problem that an image suffers from image degradation caused by blurring. Therefore, the upper limit value TEz_max for the maximum echo time TEz should be set so as to reduce blurring. Accordingly, in the present embodiment, an upper limit value TEz_max for the maximum echo time such that image degradation caused by blurring may be prevented from increasing too much is stored in the storage section 10 as a default value before imaging the subject. In the case that the region to be imaged is the abdomen, the upper limit value TEz_max for the maximum echo time is TEz_max=160 ms, for example.

Therefore, the upper limit value X1 for the echo train length such that image degradation caused by blurring may be prevented as much as possible from increasing may be represented using the upper limit value TEz_max for the maximum echo time and the echo spacing ESP by EQ. (4) below:

$$X1 = TEz\_max / ESP \qquad \text{EQ. (4)}$$

(For a condition required of the echo train length ETL in order to satisfy Condition 2)

In acquiring an echo train ET by the FSE technique, too great a value of the echo train length ETL poses a problem that image degradation caused by contrast variation due to the MT effect is exacerbated. Therefore, the upper limit value for the echo train length should be set so as to prevent contrast variation due to the MT effect from increasing too much. Accordingly, in the present embodiment, an upper limit value X2 for the echo train length such that contrast variation due to the MT effect may be prevented as much as possible from increasing is stored in the storage section as a default value before imaging the subject. In the case that the region to be imaged is the abdomen, the upper limit value X2 for the echo train length is X2=24, for example.

From the preceding description, it can be seen that the upper limit values X1 and X2 for the echo train length are values usable as the upper limit value etl_max for the echo train length. To satisfy both Conditions 1 and 2, however, a smaller one of the upper limit values X1 and X2 should be used as the upper limit value etl_max for the echo train length. Therefore, the upper limit value etl_max for the echo train length may be represented by EQ. (5) below:

$$etl\_max=min(X1,X2) \quad\quad EQ. (5)$$

In the equation, min is a function of taking a smaller one of X1 and X2. Thus, etl_max can be obtained from EQ. (5). Substituting EQ. (4) into EQ. (5) results in the following equation:

$$etl\_max=min(TEz\_max/ESP,X2) \quad\quad EQ. (6)$$

As described earlier, TEz_max and X2 are set as default values. The echo spacing ESP has been calculated at Step ST5. Therefore, by substituting the values into EQ. (6), the upper limit value etl_max for the echo train length may be obtained. For example, when X1=24, TEz_max=160 (msec), and ESP=16 (msec), then the upper limit value etl_max for the echo train length has a value as given below:

$$etl\_max=min(X1,TEz\_max/ESP)=min(24,160/16)=10$$

In the case that TEz_max/ESP is not an integer, the value for TEz_max/ESP may be obtained as an integer value by round-off, round-down, round-up, or the like. After obtaining the upper limit value etl_max for the echo train length, the process goes to Step ST7.

At Step ST7, the lower-limit-value determining unit 86 (see FIG. 2) determines a lower limit value etl_min for the echo train length. The lower limit value etl_min for the echo train length is represented by EQ. (7) below:

$$etl\_min=ceil(TE/ESP) \quad\quad EQ. (7)$$

In the equation, ceil designates a function of rounding up the value of TE/ESP. The echo time TE is TE=TE1, and the echo spacing ESP is ESP=SEP2. Therefore, the lower limit value etl_min for the echo train length may be obtained from EQ. (7). After obtaining the lower limit value etl_min for the echo train length, the process goes to Step ST8.

Figure 9:
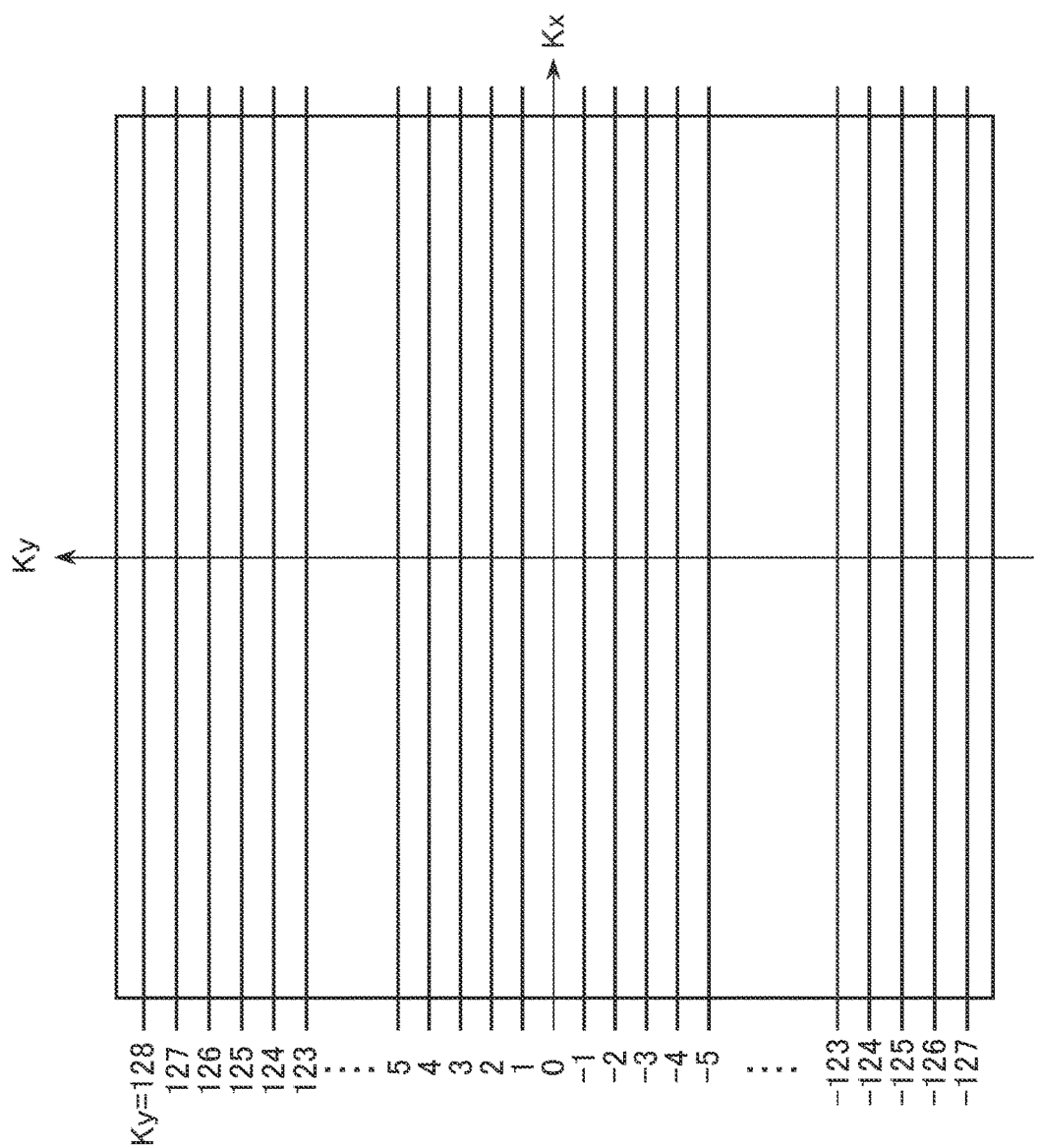
FIG. 9 is a diagram schematically showing k-space for each slice when ypoint=256.

At Step ST8, the number of views ypoint in which data acquisition is actually performed among a plurality of ky views lined up in the ky direction in k-space is obtained based on the resolution $Y_{res}=Y_{res}2$ set at Step ST4. For example, when $Y_{res}2=256$, then ypoint=256. FIG. 9 schematically shows k-space for each slice when ypoint=256. When ypoint=256, data acquisition is performed in views of ky=−127 to 128 for each slice.

In the case that a value of a time-reducing parameter for reducing the scan time is included in the scan condition, the value of ypoint is obtained taking account of the value of the time reducing parameter in addition to the resolution $Y_{res}$. One time-reducing parameter is an acceleration factor, for example, which is defined when performing a sequence using a parallel imaging technique. The acceleration factor $F_{acc}$ is a factor representing that the number of phase encoding steps PN in the sequence is decreased from to PN=$Y_{res}$ to PN=$(1/F_{acc})Y_{res}$. When defining ypoint taking account of the aceleration factor $F_{acc}$ in addition to $Y_{res}$, the number-of-views calculating unit 87 (see FIG. 2) calculates the number of views ypoint in which data acquisition is performed using EQ. (8) below:

$$ypoint=Y_{res}/F_{acc} \quad\quad EQ. (8)$$

The acceleration factor $F_{acc}$ may be set to a value of 1, 2, 3, or 4, for example. When performing a sequence in which the parallel imaging technique is not performed, for example, $F_{acc}$ is set to $F_{acc}=1$. When $F_{acc}=1$, ypoint may be expressed by EQ. (9) below:

$$ypoint=Y_{res}/F_{acc}=Y_{res} \quad\quad EQ. (9)$$

Therefore, when parallel imaging is not performed ($F_{acc}=1$), ypoint is kept at $Y_{res}$ without change.

When the parallel imaging technique is performed, $F_{acc}$ is set to a value of $F_{acc}=2$, 3, or 4. When $F_{acc}=2$, ypoint may be expressed by EQ. (10) below:

$$ypoint=Y_{res}/F_{acc}=Y_{res}/2 \quad\quad EQ. (10)$$

Figure 10:
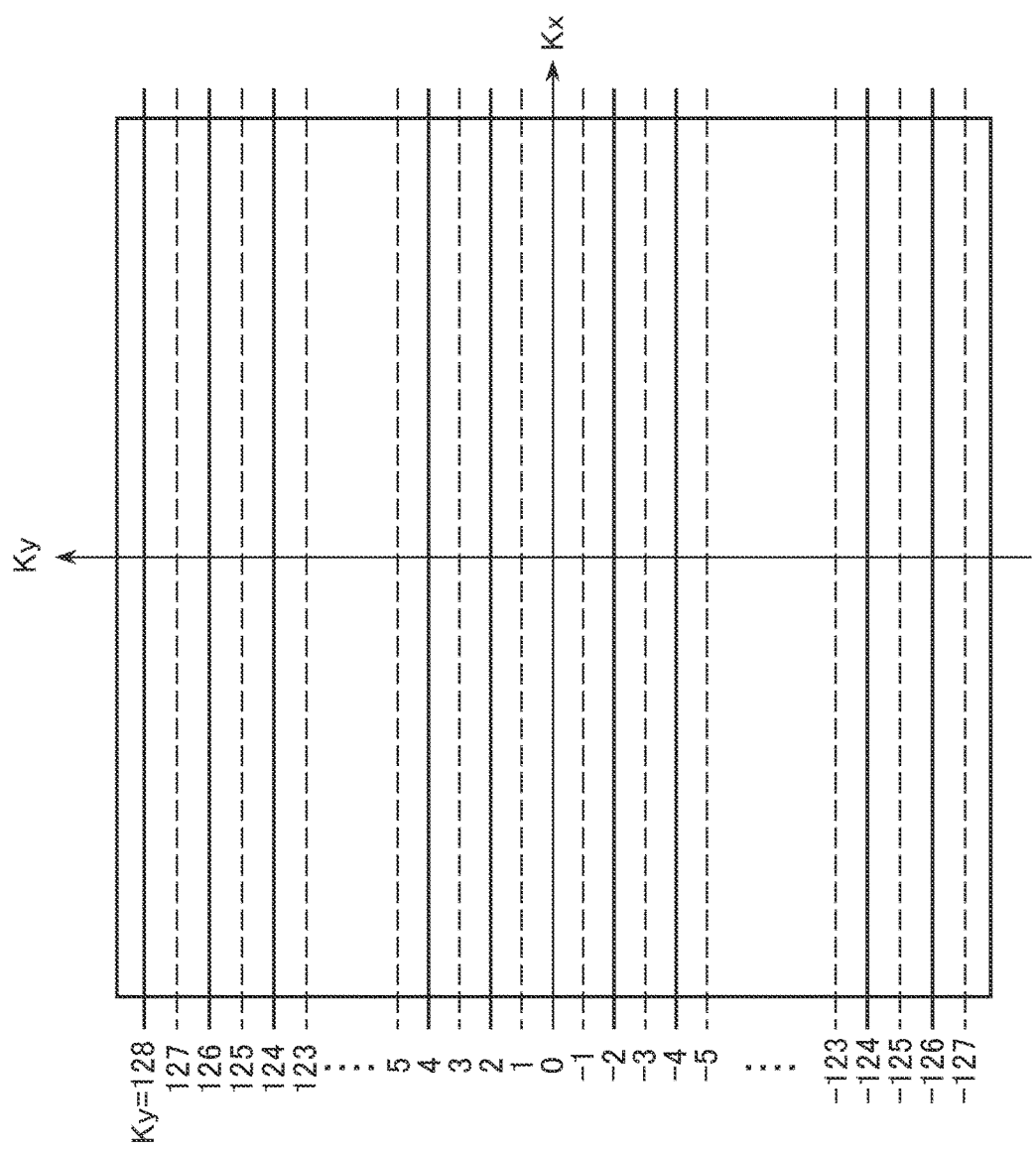
FIG. 10 is a diagram schematically showing an example of k-space when ypoint=128.

Therefore, when $F_{acc}=2$, ypoint is set to a half of $Y_{res}$. Therefore, $F_{acc}=2$ is able to halve the number of phase encoding steps in the sequence as compared with $F_{acc}=1$, thus reducing by half the number of views in which data acquisition is actually performed. For example, when $Y_{res}=256$ and $F_{acc}=2$, then ypoint=128. FIG. 10 schematically shows an example of k-space when ypoint=128. In FIG. 10, k-space is schematically shown, where data acquisition is performed in even-numbered ky views, while no data acquisition is performed in odd-numbered ky views. The even-numbered ky views in which data acquisition is performed are indicated by solid lines, while odd-numbered ky views in which no data acquisition is performed are indicated by dashed lines. Therefore, it can be seen that FIG. 10 has the number of views in which data acquisition is actually performed reduced by half as compared with that in FIG. 9.

When $F_{acc}=3$ is set, ypoint may be expressed by EQ. (11) below:

$$ypoint=Y_{res}/F_{acc}=Y_{res}/3 \quad\quad EQ. (11)$$

When $F_{acc}=3$, ypoint is set to ⅓ of $Y_{res}$. Therefore, $F_{acc}=3$ causes a number of phase encoding steps in the sequence to be ⅓ as compared with $F_{acc}=1$.

Furthermore, when $F_{acc}=4$ is set, ypoint may be expressed by EQ. (12) below:

$$ypoint=Y_{res}/F_{acc}=Y_{res}/4 \quad\quad EQ. (12)$$

When $F_{acc}=4$, ypoint is set to ¼ of $Y_{res}$. Therefore, $F_{acc}=4$ causes a number of phase encoding steps in the sequence to be ¼ as compared with $F_{acc}=1$.

As described above, when a value of the time-reducing parameter is set, ypoint is calculated taking account of the time-reducing parameter in addition to the resolution $Y_{res}$. After calculating ypoint, the process goes to Step ST9.

At Step ST9, the number-of-repetitions calculating unit 88 (see FIG. 2) obtains how many times the sequence group should be repeated at minimum to acquire data for the number of views ypoint obtained at Step ST8. Representing a minimal number of repetitions for the sequence group required to acquire data for the number of views ypoint as "m," the number of repetitions m may be expressed by EQ. (13) below using the number of views ypoint and the upper limit value etl_max for the echo train length:

$$m=ceil(ypoint/etl\_max) \quad\quad EQ. (13)$$

In the equation, ceil designates a function of rounding up the value of ypoint/etl_max. The number of repetitions m may thus be obtained from EQ. (13). For example, when ypoint=256 and etl_max=23, the number of repetitions m has a value as follows:

$$m=ceil(ypoint/etl\_max)=ceil(256/24)=11$$

In FIG. 8, the number of repetitions m calculated by the number-of-repetitions calculating unit 88 is represented as "m2."

After obtaining the number of repetitions m, the process goes to Step ST10.

At Step ST10, the echo-train-length calculating unit 89 (see FIG. 2) calculates an echo train length ETL required to acquire data for ypoint by the number of repetitions m calculated at Step ST9. The echo train length ETL may be calculated by EQ. (14) below:

$$ETL=\text{ceil}(ypoint/m) \qquad \text{EQ. (14)}$$

EQ. (14) gives the minimum value for the echo train length required to acquire data for ypoint by the number of repetitions m. When ypoint=256 and m=11, for example, the echo train length ETL has a value given by:

$$ETL=\text{ceil}(ypoint/m)=\text{ceil}(256/11)=24$$

In FIG. 8, the echo train length ETL calculated by the echo-train-length calculating unit 89 is represented as "ETL2." In the case that ETL obtained by EQ. (14) is smaller than the lower limit value etl_min for the echo train length obtained at Step ST7, the echo train length ETL may be set to the lower limit value etl_min. Once the echo train length ETL has been obtained, the process goes to Step ST11.

At Step ST11, the TR determining unit 90 (see FIG. 2) determines a value for the repetition time TR2 that reduces the scan time. In FIG. 8, TR determined by the TR determining unit 90 is represented as "TR2." Once TR has been determined, the flow is terminated.

In the present embodiment, the upper limit value etl_max for the echo train length is set so that Conditions 1 and 2 are satisfied (Step ST6). The number of views ypoint in which data acquisition is performed is then calculated (Step ST8), the number of repetitions m is calculated based on the upper limit value etl_max for the echo train length (Step ST9), and the echo train length ETL is calculated based on the number of views ypoint and number of repetitions m (Step ST10). Therefore, the echo train length suitable for obtaining an image with reduced image degradation caused by contrast variation due to the MT effect and/or by blurring can be automatically calculated, thus eliminating the need for cumbersome operations that the operator would otherwise perform, such as an operation of manually modifying the echo train length, which mitigates stress in operation on the operator.

Moreover, according to the present embodiment, even in the case that the echo train length ETL1 defined in the scan condition A1 exceeds the upper limit value for the echo train length, a scan condition A2 preventing the echo train length from exceeding the upper limit value etl may be obtained by performing Step ST20.

In the present embodiment, a period of time t1−Δt, which is shorter than the scan time t1 by Δt, is obtained as a target value $T_{scan}$ for the scan time at Step ST3. This gives a scan condition A2 that enables a scan on the subject to be achieved so that Conditions 1 and 2 are satisfied in a scan time shorter than the scan time t1.

Figure 11:
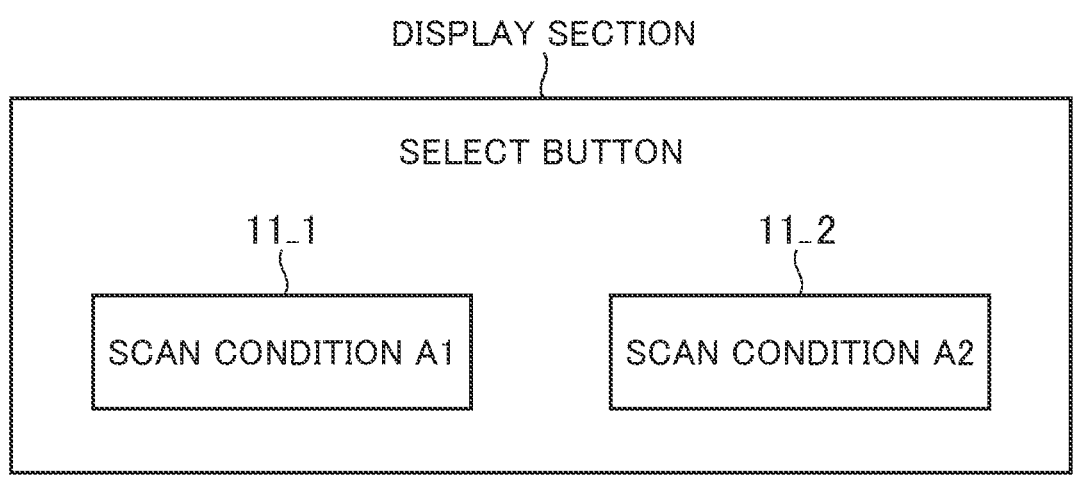
FIG. 11 is a diagram schematically showing an exemplary screen of a display section for presenting each of the scan conditions A1 and A2 to an operator.

The display section may display a screen for presenting each of the scan conditions A1 and A2 to the operator after obtaining the scan condition A2 (see FIG. 11). FIG. 11 is a diagram schematically showing an exemplary screen of the display section for presenting each of the scan conditions A1 and A2 to the operator.

Two select buttons 11_1 and 11_2 are displayed in the display section.

The select button 11_1 is a button for presenting the scan condition A1 to the operator, while the select button 11_2 is a button for presenting the scan condition A2 to the operator.

Upon clicking on of a select button by the operator, specific parameter values, etc. in a scan condition corresponding to the select button are displayed. Therefore, the operator can observe the two scan conditions having different scan times, and select an optimal one from between the two scan conditions.

In the case that a scan time $T_{scan}$ is calculated based on the scan condition A2 and a difference in time between the scan time $T_{scan}$ and target value $T_{tar}$ is greater than a predefined value, Step ST20 may be performed again to obtain a new scan condition. Moreover, in the case that the value of the repetition time TR=TR2 does not fall within an allowable range BR (for example, BR=2500 to 5000 msec) for the repetition time TR, Step ST20 may be performed again to obtain a new scan condition.

Figure 12:
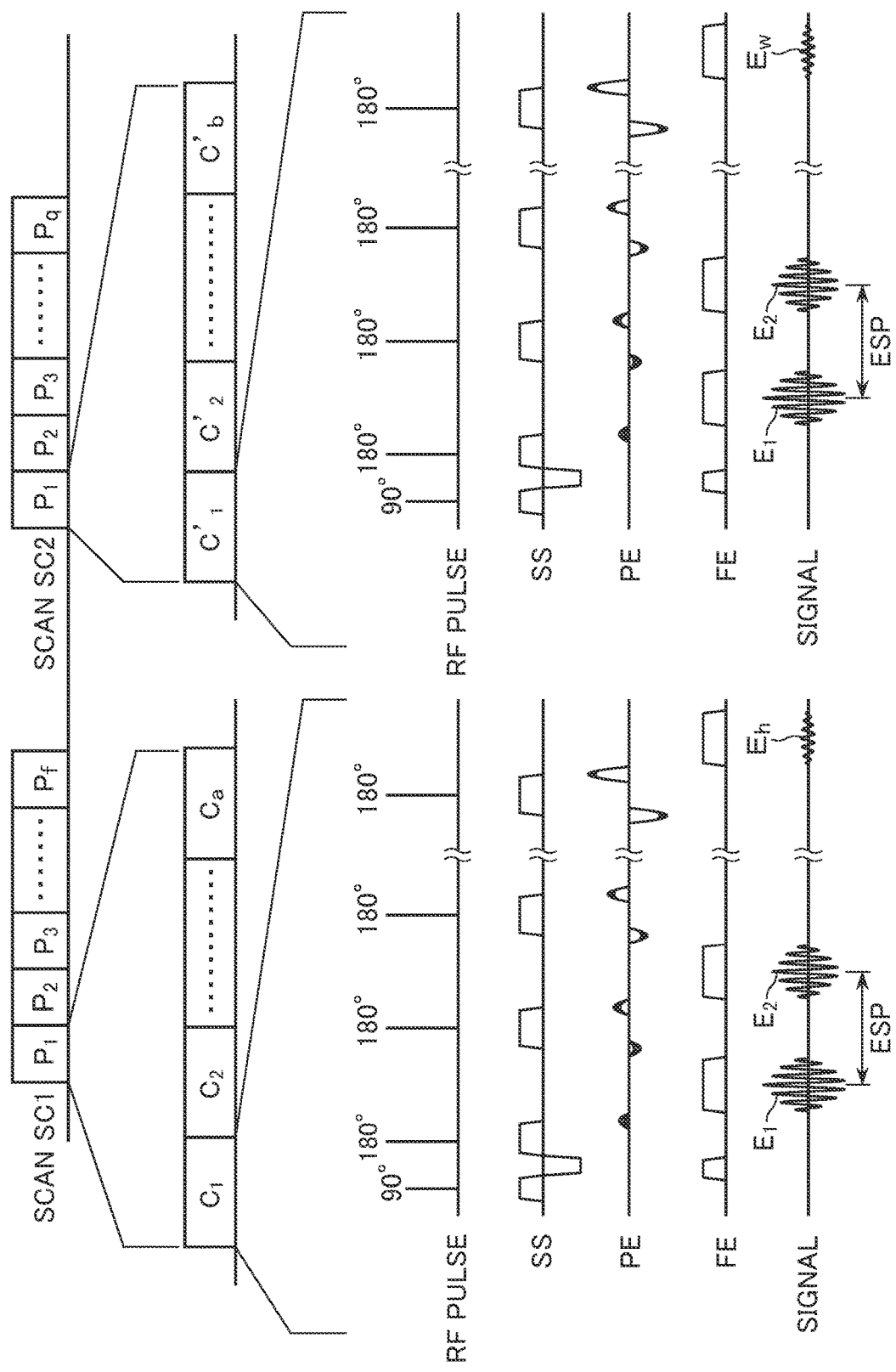
FIG. 12 is an explanatory diagram of data acquisition divided over a plurality of times.

Moreover, in the case that the scan time $T_{scan}$ is too much longer than the target value $T_{tar}$, or the repetition time TR exceeds the upper limit value (for example, 5000 msec) of the allowable range BR of the repetition time TR, the scan condition may be set so that data for a plurality of slices are acquired separately in a plurality of separate scans (see FIG. 12).

FIG. 12 is an explanatory diagram of data acquisition divided over a plurality of times.

FIG. 12 shows a case in which data in a plurality of slices are acquired separately in two scans SC1 and SC2. By thus acquiring data for slices separately in a plurality of scans, the scan time for each scan may be reduced and/or the repetition time TR may be reduced. Therefore, in the case that a breath-holding scan is to be performed and a subject has trouble with long time breath-holding, it is possible to scan the subject with an echo train length suitable for obtaining an image with reduced image degradation caused by contrast variation due to the MT effect or by blurring by performing a scan separately in a plurality of number of times. It should be noted that the present invention is not limited to the breath-holding scan and may be applied to a scan for imaging a subject under free breathing.

Figure 13:
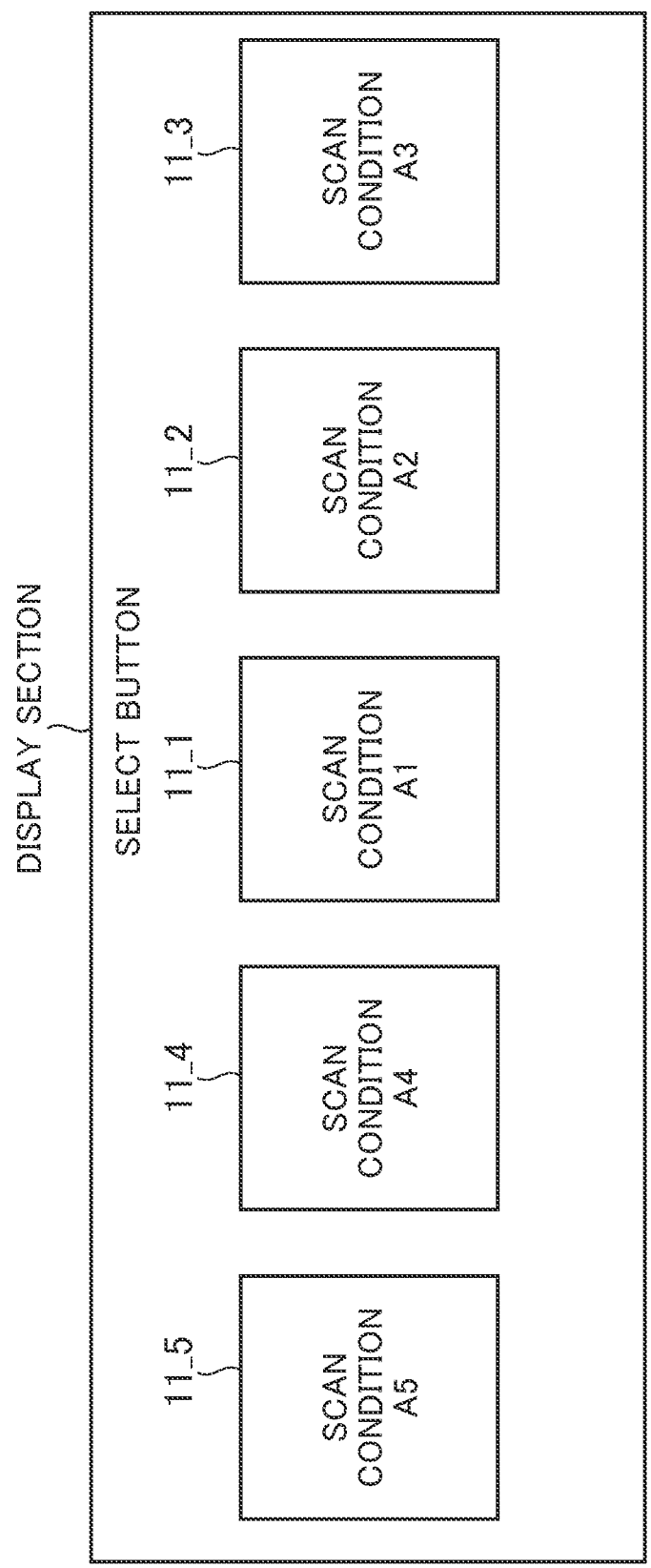
FIG. 13 is a diagram schematically showing an exemplary screen for presenting scan conditions to the operator.

While a period of time shorter than the scan time t1 by Δt is defined as the target value $T_{scan}$ for the scan time in the present embodiment, a period of time longer than the scan time t1 by Δt may be defined as the target value $T_{scan}$ for the scan time. Since in this case, the resolution $Y_{res}2$ in the scan condition A2 may be defined as a value greater than the resolution $Y_{res}1$ in the scan condition A1, it is possible to obtain a scan condition A2 suitable for obtaining an image with higher quality. Alternatively, it may be contemplated that both a value smaller than the scan time t1 and a value greater than the scan time t1 are determined as target values for the scan time, scan conditions corresponding to the respective target values for the scan time are obtained, and the display section is caused to display a screen for presenting these scan conditions to the operator (see FIG. 13). FIG. 13 is a diagram schematically showing an example of such a screen.

The display section shows five select buttons 11_1 to 11_5.

The select button 11_1 is a button for presenting the scan condition A1 (scan time t1) to the operator.

The select button 11_2 is a button for presenting to the operator the scan condition A2 for scanning the subject in a scan time t1−Δt.

The select button 11_3 is a button for presenting to the operator a scan condition A3 for scanning the subject in a scan time t1−2Δt.

The select button 11_4 is a button for presenting to the operator a scan condition A4 for scanning the subject in a scan time t1+Δt.

The select button 11_5 is a button for presenting to the operator a scan condition A5 for scanning the subject in a scan time t1+2Δt.

Upon clicking on of a select button by the operator, specific parameter values, etc. in a scan condition corresponding to the select button are displayed. Therefore, the operator can observe the five scan conditions having different scan times, and select an optimal one from among the five scan conditions.

In the present embodiment, a smaller one of two values X1 and X2 usable as the upper limit value for the echo train length is determined as the upper limit value etl_max for the echo train length. However, in the case that the contrast variation due to the MT effect is not very large, the value X1 usable as the upper limit value for the echo train length may be used as the upper limit value etl_max for the echo train length.

While the fast spin echo technique is described in the present embodiment, the present invention is applicable to imaging techniques that acquire an echo train.

The invention claimed is:

1. A magnetic resonance apparatus comprising:
 a scanning section including at least a transmit coil generating radio frequency (RF) pulses to a subject and a receive coil receiving signals from the subject, wherein the scanning section is configured to perform for performing a sequence having an excitation pulse for exciting a region of the subject to be imaged for acquiring an echo train from the subject;
 a processor including at least an upper-limit value determining unit, a number-of-views calculating unit, and an echo-train-length calculating unit, wherein:
  the upper-limit-value determining unit is configured to calculate a first value usable as an upper limit value for an echo train length of the echo train based on a period of time between the excitation pulse and a last echo in the echo train and on echo spacing in the echo train, and to determine the upper limit value for the echo train length based on the first value;
  the number-of-views calculating unit is configured to obtain a number of views in which data acquisition is performed in k-space; and
  the echo-train-length calculating unit is configured to obtain the echo train length in performing the sequence based on the upper limit value for the echo train length and the number of views.

2. The magnetic resonance apparatus as recited in claim 1, wherein the upper-limit-value determining unit is configured to determine the upper limit value for the echo train length based on the first value and a second value usable as the upper limit value for the echo train length.

3. The magnetic resonance apparatus as recited in claim 2, wherein the second value is a value defined taking account of contrast variation caused by an MT effect.

4. The magnetic resonance apparatus as recited in claim 2, wherein the upper-limit-value determining unit is configured to determine the upper limit value for the echo train based on a smaller one of the first and second values.

5. The magnetic resonance apparatus as recited in claim 2, wherein in the case that the first value is smaller than the second value, the upper-limit-value determining unit is configured to determine the first value as the upper limit value for the echo train.

6. The magnetic resonance apparatus as recited in claim 5, wherein in the case that the first value is not an integer, the upper-limit-value determining unit is configured to convert the first value into an integer.

7. A magnetic resonance apparatus comprising:
 a scanning section including at least a transmit coil generating radio frequency (RF) pulses to a subject and a receive coil receiving signals from the subject, wherein the scanning section is configured to perform a sequence group including a plurality of sequences within a repetition time, each sequence having an excitation pulse for exciting a region of the subject to be imaged for acquiring an echo train from the subject;
 a processor including at least an upper-limit value determining unit, a number-of-views calculating unit, a number-of-repetitions calculating unit, and an echo-train-length calculating unit, wherein:
  the upper-limit value determining unit is configured to determine an upper limit value for an echo train length of the echo train based on echo spacing in the echo train;
  the number-of-views calculating unit is configured to obtain a number of views in which data acquisition is performed in k-space;
  the number-of-repetitions calculating unit is configured to calculate a minimal number of repetitions for the sequence group required to acquire data in k-space based on the upper limit value for the echo train length and the number of views; and
  the echo-train-length calculating unit is configured to calculate the echo train length based on the number of repetitions.

8. The magnetic resonance apparatus as recited in claim 7, wherein the-number-of-views calculating unit is configured to obtain the number of views based on a resolution in a phase-encoding direction and a time-reducing parameter for reducing a scan time.

9. The magnetic resonance apparatus as recited in claim 8, wherein the time-reducing parameter is a parameter for reducing the number of phase encoding steps.

10. The magnetic resonance apparatus as recited in claim 7, further comprising a TR determining unit configured to determine the repetition time.

11. The magnetic resonance apparatus as recited in claim 1, further comprising: a lower-limit-value determining unit configured to determine a lower limit value for the echo train length based on the echo spacing.

12. The magnetic resonance apparatus as recited in claim 11, wherein the lower-limit-value determining unit is configured to determine the lower limit value for the echo train based on the echo spacing and an effective echo time.

13. The magnetic resonance apparatus as recited in claim 1, wherein the magnetic resonance apparatus sets a second scan condition for scanning the subject based on a first scan condition for scanning the subject.

14. The magnetic resonance apparatus as recited in claim 13, further comprising:
 a scan-time calculating unit configured to calculate a first scan time taken to scan the subject according to the first scan condition; and
 a target-value defining unit configured to define a target value for the scan time used for obtaining the second scan condition.

15. The magnetic resonance apparatus as recited in claim 14, further comprising a parameter-value defining unit configured to define parameter values in the second scan condition.

16. The magnetic resonance apparatus as recited in claim 15, wherein the echo-train-length calculating unit is configured to obtain an echo train length in said second scan condition.

17. The magnetic resonance apparatus as recited in claim 16, wherein according to the second scan condition, data in a plurality of slices are acquired separately over a plurality of scans.

18. A computer-implemented method performed by a magnetic resonance apparatus having at least a transmit coil generating radio frequency (RF) pulses and a receive coil receiving signals from the subject, a processor, and non-transitory recording medium storing therein a program, the program when executed by the processor, causing the processor to perform the method, the method comprising:
  performing a sequence having an excitation pulse for exciting a region of the subject to be imaged for acquiring an echo train from the subject;
  calculating a first value usable as an upper limit value for an echo train length of the echo train based on a period of time between the excitation pulse and a last echo in the echo train and on an echo spacing in the echo train;
  determining the upper limit value for the echo train length based on the first value;
  obtaining a number of views in which data acquisition is performed in k-space; and
  obtaining the echo train length in performing the sequence based on the upper limit value for the echo train length and the number of views.

* * * * *